United States Patent
Kim et al.

(10) Patent No.: US 8,692,258 B2
(45) Date of Patent: Apr. 8, 2014

(54) ARRAY SUBSTRATE OF TFT-LCD INCLUDING A BLACK MATRIX AND METHOD FOR MANUFACTURING THE SAME

(75) Inventors: Won Seok Kim, Beijing (CN); Young Min Kim, Beijing (CN); Pil Seok Kim, Beijing (CN)

(73) Assignees: BOE Technology Group Co., Ltd., Beijing (CN); Chengdu BOE Optoelectronics Technology Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/239,744

(22) Filed: Sep. 22, 2011

(65) Prior Publication Data

US 2012/0181557 A1   Jul. 19, 2012

(30) Foreign Application Priority Data

Jan. 18, 2011   (CN) .......................... 2011 1 0020242

(51) Int. Cl.
*H01L 27/14* (2006.01)
*H01L 21/00* (2006.01)

(52) U.S. Cl.
USPC .................. 257/72; 257/E33.062; 438/30

(58) Field of Classification Search
USPC ............. 438/30, 48, 128, 149, 151, 157, 161, 438/283; 257/57, 59, 72, 83, 98, 257, 290, 257/351, 368, 392
See application file for complete search history.

(56) References Cited

U.S. PATENT DOCUMENTS

| | | | |
|---|---|---|---|
| 6,466,281 B1 * | 10/2002 | Huang et al. ..................... | 349/44 |
| 6,522,315 B2 * | 2/2003 | Ozawa et al. .................... | 345/92 |
| 2002/0101557 A1 | 8/2002 | Ono et al. | |
| 2004/0263754 A1 * | 12/2004 | Ahn et al. ....................... | 349/141 |
| 2004/0266082 A1 * | 12/2004 | You ................................ | 438/197 |
| 2007/0126953 A1 | 6/2007 | Lai et al. | |
| 2007/0252142 A1 * | 11/2007 | Yoon ............................... | 257/40 |
| 2007/0273819 A1 * | 11/2007 | Kawasaki et al. ............. | 349/141 |
| 2008/0002126 A1 | 1/2008 | Lim et al. | |
| 2008/0309864 A1 * | 12/2008 | Lee et al. ........................ | 349/139 |
| 2010/0003776 A1 * | 1/2010 | Park ................................ | 438/30 |
| 2010/0040960 A1 * | 2/2010 | Piao et al. ........................ | 430/5 |
| 2010/0320464 A1 * | 12/2010 | Chang et al. .................... | 257/57 |

FOREIGN PATENT DOCUMENTS

| | | |
|---|---|---|
| CN | 1369731 A | 9/2002 |
| CN | 101078824 A | 11/2007 |
| CN | 101097925 A | 1/2008 |

(Continued)

OTHER PUBLICATIONS

KIPO Examination Report dated Feb. 1, 2013; Appln. No. 10-2011-0119470.

(Continued)

*Primary Examiner* — Lex Malsawma
(74) *Attorney, Agent, or Firm* — Ladas & Parry LLP

(57) ABSTRACT

The disclosed technology is in connection with an array substrate of a thin film transistor liquid crystal display (TFT-LCD) and a method for manufacturing the same, and the array substrate comprises: a base substrate; a gate line and a data line forming on the base substrate and defining a pixel region, a pixel electrode, a thin film transistor and a common electrode are formed in the pixel region; a black matrix made of conductive thin film material, the black matrix is electrically connected with the common electrode.

19 Claims, 9 Drawing Sheets

(56) References Cited

FOREIGN PATENT DOCUMENTS

| | | | |
|---|---|---|---|
| CN | 100517033 A | | 7/2009 |
| JP | 10-186407 A | | 7/1998 |
| JP | 11-337976 A | | 12/1999 |
| JP | 2003207808 A | * | 7/2003 |

OTHER PUBLICATIONS

Third Chinese Office Action dated Jul. 31, 2013; Appln. No. 201110020242.3.
Third Chinese Office Action dated Jan. 29, 2014; Appln. No. 201110020242.3.

* cited by examiner 12  9  1  3  8  13  14

11

A2 - A2

1  2

A4 - A4

B4 - B4

A5 – A5

B5 – B5

A6 - A6

ARRAY SUBSTRATE OF TFT-LCD INCLUDING A BLACK MATRIX AND METHOD FOR MANUFACTURING THE SAME

BACKGROUND

Embodiments of the disclosed technology relate to an array substrate of a thin film transistor liquid crystal display and a method for manufacturing the same.

In the thin film transistor liquid crystal display (TFT-LCD) technology, Advanced-Super Dimensional Switching (AD-SDS) is one of the technologies for improving the display quality of a LCD.

An AS-SDS LCD forms a multi-dimensional space composite field by a parallel electric field generated by edges of pixel electrodes in the same plane and a vertical electric field generated between common electrodes and pixel electrodes, so that liquid crystal molecules between the pixel electrodes within a liquid crystal unit and immediately above the electrodes can rotate in all orientations, thereby improving work efficiency of in-plane orientation type liquid crystal and increasing the light transmission efficiency. AS-SDS can improve the display quality of a TFT-LCD, and has advantages of high transmittance, wide viewing angle, high aperture ratio, low chromatic aberration, short response time, free of push Mura, etc.

The main structure of a TFT-LCD typically comprises an array substrate and a color filter substrate forming a liquid crystal cell with a liquid crystal layer interposed therebetween. Gate lines, data lines, pixel electrodes, thin film transistors, and common electrodes of a strip structure are formed on the array substrate. A color resin pattern and a black matrix pattern are formed on the color filter substrate, and the black matrix pattern is mainly used to block the light leakage area. In the structure of an early AD-SDS TFT-LCD, the black matrix pattern on the color filter substrate is usually prepared with a resin material. A width of the black matrix is determined mainly based on the width of the data lines on the array substrate. With an improving requirement of LCD aperture ratio, the width of the data lines becomes narrower and narrower, so the black matrix of the resin material gradually becomes one of the main factors of blocking the increase of aperture ratio.

To increase aperture ratio, it has been proposed that the black matrix pattern is prepared with a metal material. Although this technology can reduce the width of the black matrix, the metal black matrix may lead to electric field distortion and reducing display quality of the AD-SDS TFT-LCD. To avoid electric field distortion, it has been proposed a technology of connecting the black matrix on the color filter substrate with the common electrode on array substrate. Specifically, during preparing the color filter substrate and the array substrate, via holes are opened in overcoat layers respectively so as to form transfer dots, the black matrix on the color filter substrate is electrically connected to the common electrode on array substrate through the transfer dots. However, in operation, this technology not only gives rise to high cost, but also incurs common electrode delay defect or the like. Firstly, it is necessary to have extra procedures and extra patterning apparatus for the fabrication of the transfer dots, so the production cost is increased. Secondly, since the common electrode and the black matrix are located on different substrates, respectively, and are connected with each other through the transfer dots, this structure causes a significant delay in the common electrode, and making this technology difficult for the application such as a large-sized display, a liquid crystal TV set, and so on.

SUMMARY

An embodiment of the disclosed technology provides an array substrate of TFT-LCD, comprising: a base substrate; gate lines and data lines forming on the base substrate and defining pixel regions, wherein a pixel electrode, a thin film transistor, and a common electrode which forms a multi-dimensional space composite field together with the pixel electrode, are disposed in each of the pixel regions, and a black matrix made of a conductive material, wherein the black matrix is electrically connected with the common electrode.

Another embodiment of the disclosed technology further provides a method for manufacturing an array substrate of TFT-LCD, comprising: step 1, forming a gate line, a date line, a pixel electrode and a thin film transistor on a base substrate; and step 2, forming a common electrode and a black matrix on the base substrate after step 1, the black matrix is electrically connected with the common electrode.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1:
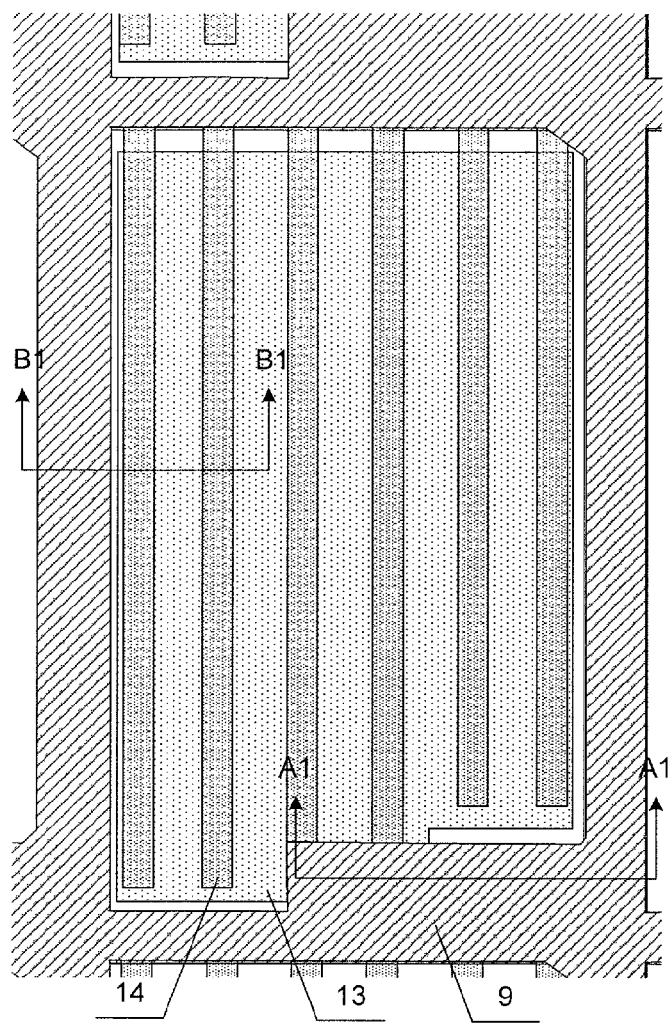
FIG. 1 is a plan view of an array substrate of a TFT-LCD according to a first embodiment of the disclosed technology.

The disclosed technology is further described in detail by the following drawings and embodiments. The thickness of respective thin film layer and the size of regions in the drawings do not show a real ratio of an array substrate of TFT-LCD, and it is only for the purpose of illustrating the content of the disclosed technology.

Figure 2:
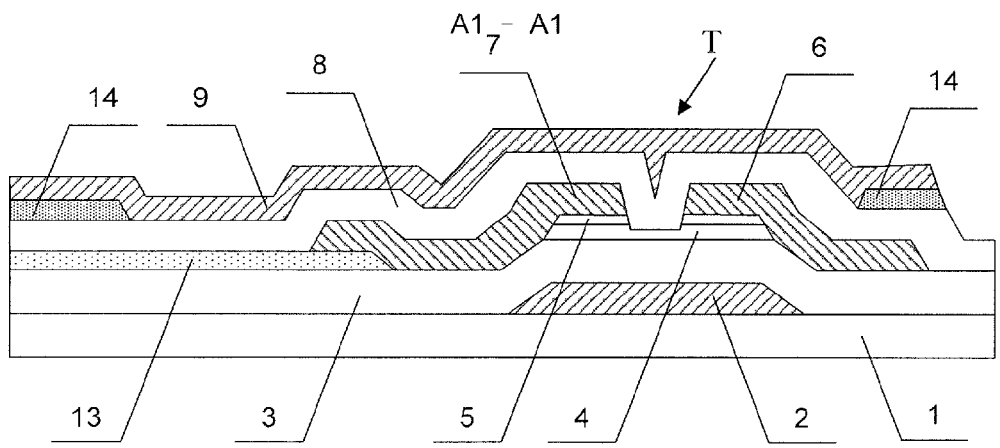
FIG. 2 is a cross-sectional view taken along a line A1-A1 in FIG. 1
Figure 3:
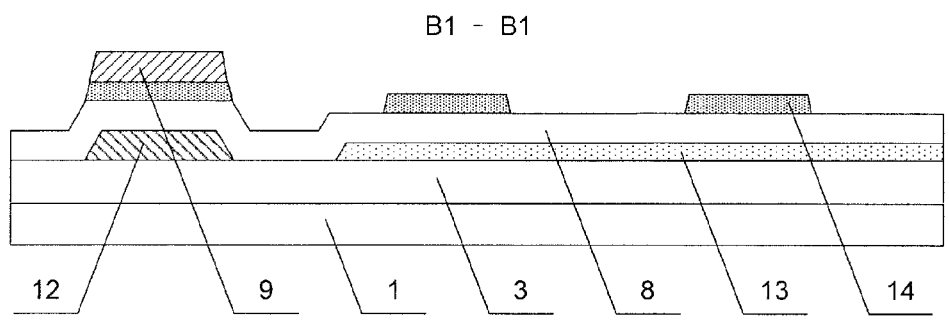
FIG. 3 is a cross-sectional view taken along a line B1-B1 in FIG. 1.

FIG. 1 is a plan view of an array substrate of a TFT-LCD according to a first embodiment of the disclosed technology, showing one pixel region, FIG. 2 is a cross-sectional view taken along a line A1-A1 in FIG. 1, and FIG. 3 is a cross-sectional view taken along a line B1-B1 in FIG. 1.

As FIGS. 1-3 shown, the main structure of each pixel region of the array substrate of the TFT-LCD according to an embodiment of the disclosed technology comprises a gate line 11, a date line 12, a pixel electrode 13, a common electrode 14, a black matrix 9, and a thin film transistor T formed on a base substrate 1. The gate line 11 crosses the date line 12 to define the pixel region, and the pixel electrode 13, the common electrode 14, and the thin film transistor T are formed in each pixel region. The gate line 11 is used to provide a turn-on (ON) signal or a turn-off (OFF) signal to the thin film transistor T. The data line 12 is used to provide a date signal to the thin film transistor T for performing display. The common electrode 14 is formed to comprise a plurality f strip electrodes arranged in sequence, and is used to form a multi-dimensional space composite field together with the pixel electrode 13 which is provided below the common electrode 14. The black matrix 9 made of a metal thin film material is formed above the gate line 11, the data line 12, and the thin film transistor T, and is connected with the common electrode 14, so as to not only block a light leakage area, but also serve as a connection bus line for the common electrodes 14 of pixel regions.

Specifically, each pixel region of the array substrate of the TFT-LCD according to the embodiment of the disclosed technology comprises the gate line 11 and a gate electrode 2 formed on the base substrate 1, the gate electrode 2 is connected with the gate line 11; a gate insulating layer 3 is formed on the gate line 11 and the gate electrode 2 and covers the entire base substrate 1; an active layer (comprising a laminated structure of a semiconductor layer 4 and a doped semiconductor layer 5) of the thin film transistor is formed on the gate insulating layer 3 and is located above the gate electrode 2; the pixel electrode 13 is formed on the gate insulating layer 3 and is located within respective pixel region; one end of a source electrode 6 of the thin film transistor is located on the active layer, and the other end is connected with the date line 12, while one end of a drain electrode 7 is located on the active layer, and the other end is connected with the pixel electrode 13, and a TFT channel region is defined between the source electrode 6 and the drain electrode 7, the doped semiconductor layer 5 in the channel region is completely removed, and a part of the thickness of the semiconductor layer 4 is also removed, so that the semiconductor layer 4 in the channel region is exposed; a passivation layer 8 is formed on the resultant structure and covers the entire base substrate 1; the common electrode 14 is formed on the passivation layer 8; the black matrix 9 is formed on the above resultant structure, is located above the gate line 11, the date line 12, and the thin film transistor, and is directly connected with the common electrode 14.

In the above embodiment, the pixel electrode 13 is in a plate shape. However, the pixel electrode 13 also may have a plurality of slits parallel with each other, corresponding to the strip electrodes of the common electrode 14; or, the pixel electrode 13 also may comprise a plurality of strip electrodes parallel with each other, and space between the strip electrodes of the pixel electrode 13 corresponds to the strip electrode of the common electrode 14.

FIGS. 4-13 are schematic views of the processes for manufacturing the array substrate of the TFT-LCD according to the first embodiment of the disclosed technology, further illustrating the disclosed technology. The pixel electrode in a plate shape is used as an example in this embodiment. Hereinafter, a patterning process referred to in the following description may comprises coating photoresist, masking, exposing and developing photoresist, etching by using a photoresist pattern, and removing photoresist, etc., and here photoresist used is of a positive photoresist type, for example.

Figure 4:
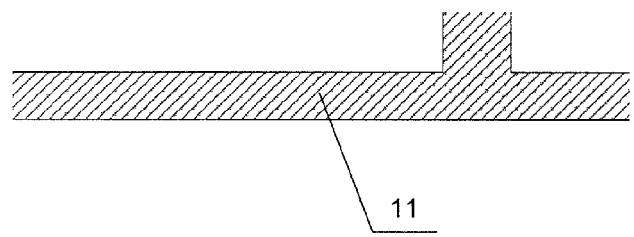
FIG. 4 is a plan view of the array substrate of the TFT-LCD after a first patterning process, according to the first embodiment of the disclosed technology.
Figure 4:
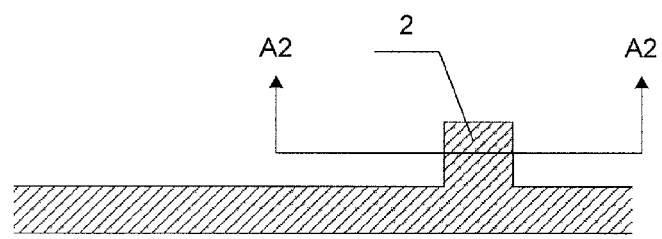
Figure 5:
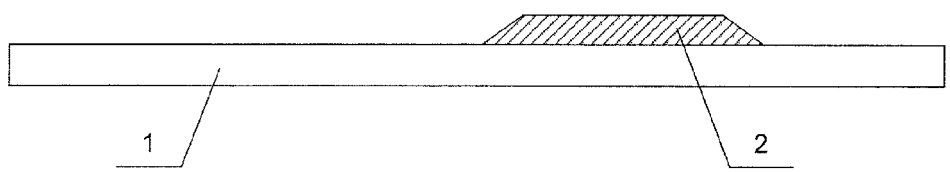
FIG. 5 is a cross-sectional view taken along a line A2-A2 in FIG. 4.

FIG. 4 is a plan view of the array substrate of the TFT-LCD after a first patterning process according to the first embodiment of the disclosed technology, and shows a structure of one pixel region, and FIG. 5 is a cross-sectional view taken along a line A2-A2 in FIG. 4.

Firstly, a gate metal thin film is deposited on the base substrate 1 (e.g., a glass substrate or quartz substrate) by a magnetron sputtering method or a thermal evaporating method, and then the gate metal thin film is patterned by a patterning process using a common mask, so as to form a pattern comprising the gate line 11 and the gate electrode 2 connected to the gate line 11, as shown in FIGS. 4 and 5.

Figure 6:
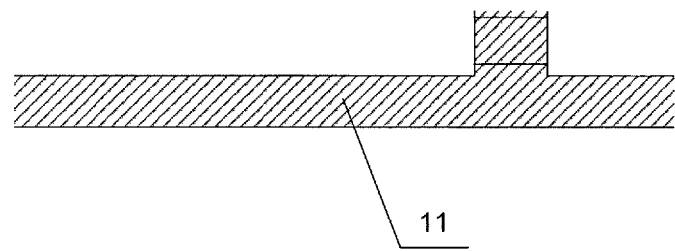
FIG. 6 is a plan view of the array substrate of the TFT-LCD after a second patterning process, according to the first embodiment of the disclosed technology.
Figure 6:
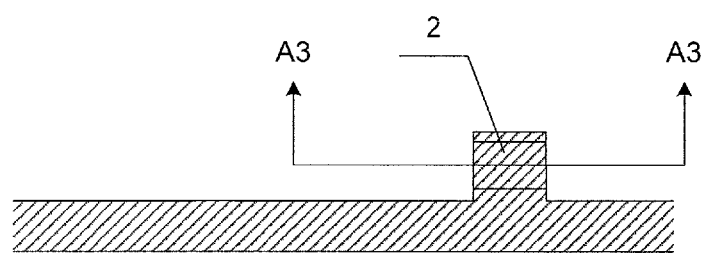
Figure 7:
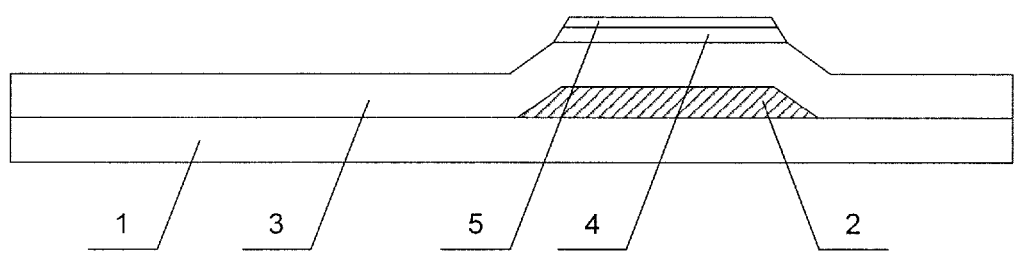
FIG. 7 is a cross-sectional view taken along a line A3-A3 in FIG. 6.

FIG. 6 is a plan view of the array substrate of the TFT-LCD after a second patterning process according to the first embodiment of the disclosed technology, and shows a structure of one pixel region, and FIG. 7 is a cross-sectional view taken along a line A3-A3 in FIG. 6.

The gate insulating layer, the semiconductor thin film and the doped semiconductor thin film are deposited in sequence on the base substrate with the pattern as shown in FIG. 4, by a plasma enhanced chemical vapor deposition (PECVD) method. A laminated layer structure of the gate insulating layer, the semiconductor thin film and the doped semiconductor thin film is patterned by a patterning process using a common mask plate, so as to form a pattern comprising the active layer of the thin film transistor. The active layer comprises the laminated semiconductor layer 4 and doped semiconductor layer 5, is formed on the gate insulating layer, and is located above the gate electrode 2, as shown in FIGS. 6 and 7.

Figure 8:
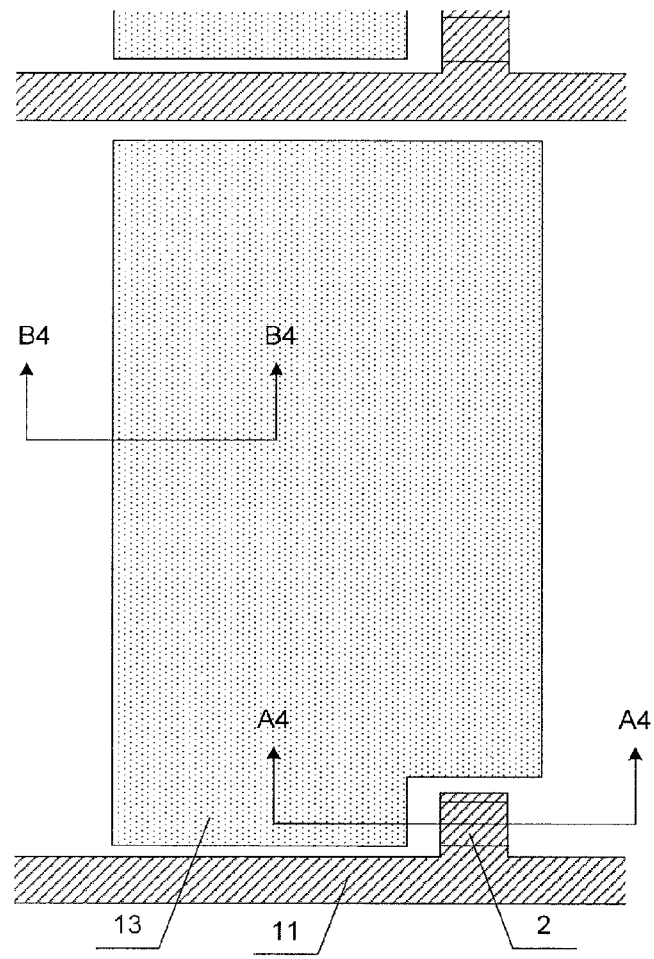
FIG. 8 is a plan view of the array substrate of the TFT-LCD after a third patterning process, according to the first embodiment of the disclosed technology.
Figure 9:
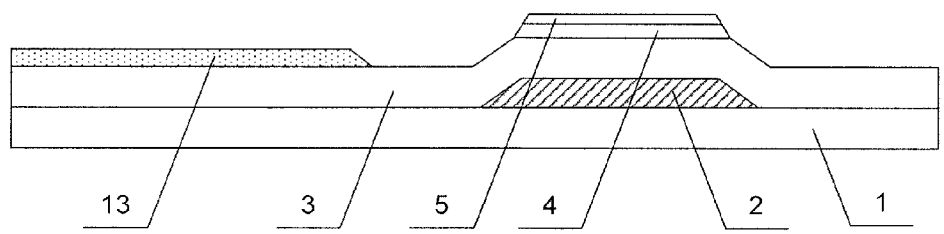
FIG. 9 is a cross-sectional view taken along a line A4-A4 in FIG. 8.
Figure 10:
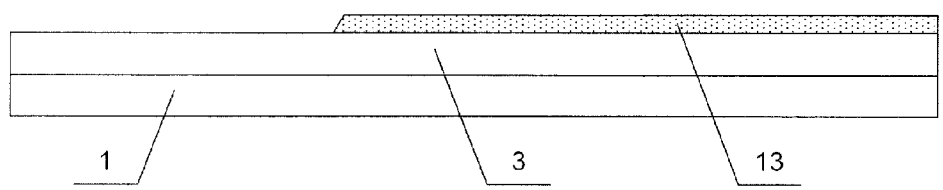
FIG. 10 is a cross-sectional view taken along a line B4-B4 in FIG. 8.

FIG. 8 is a plan view of the array substrate of the TFT-LCD after a third patterning process according to the first embodiment of the disclosed technology, and shows a structure of one pixel region, FIG. 9 is a cross-sectional view taken along a line A4-A4 in FIG. 8, and FIG. 10 is a cross-sectional view taken along a line B4-B4 in FIG. 8.

A transparent conductive thin film is deposited on the base substrate with the pattern as shown in FIG. 6, by a magnetron sputtering method or a thermal evaporating method. The transparent conductive thin film is patterned by a patterning process using a common mask plate, so as to form a pattern comprising the pixel electrode 13 within the pixel region, as shown in FIGS. 8-10.

Figure 11:
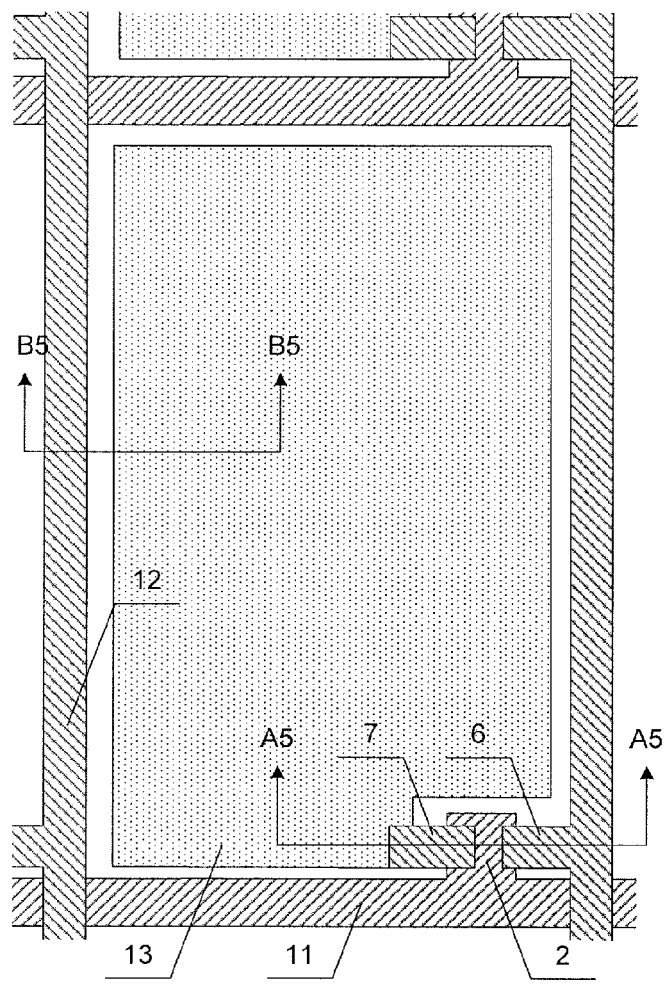
FIG. 11 is a plan view of the array substrate of the TFT-LCD after a fourth patterning process, according to the first embodiment of the disclosed technology.
Figure 12:
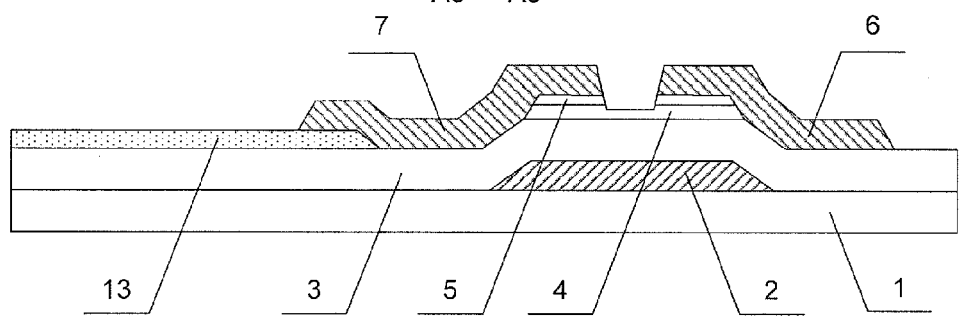
FIG. 12 is a cross-sectional view taken along a line A5-A5 in FIG. 11.
Figure 13:
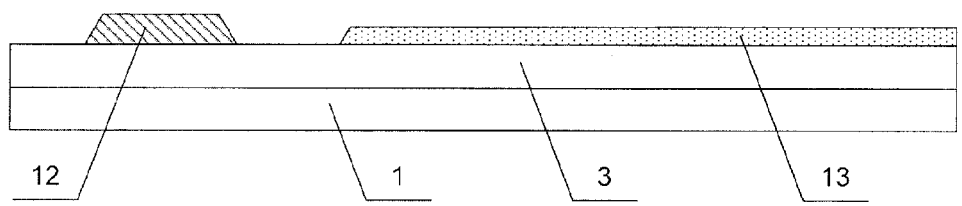
FIG. 13 is a cross-sectional view taken along a line B5-B5 in FIG. 11.

FIG. 11 is a plan view of the array substrate of the TFT-LCD after a fourth patterning process according to the first embodiment of the disclosed technology, showing one pixel region, FIG. 12 is a cross-sectional view taken along a line A5-A5 in FIG. 11, and FIG. 13 is a cross-sectional view taken along a line B5-B5 in FIG. 11.

A source and drain metal thin film is deposited on the base substrate with the pattern as shown in FIG. 8, by a magnetron sputtering method or a thermal evaporating method, so as to form a pattern comprising the date line 12 and the source electrode 6, the drain electrode 7, and the channel region, etc., of the thin film transistor, as shown in FIGS. 11-13. After this patterning process, one end of the source electrode 6 of each thin film transistor is located on the active layer, and the other end is connected with the date line 12; one end of the drain electrode 7 is located on the active layer, and the other end is directly connected with the pixel electrode 13. The channel region is defined between the source electrode 6 and the drain electrode 7. The doped semiconductor layer 5 in the channel region is completely removed, and a part of the thickness of the semiconductor layer 4 is also removed, so that the semiconductor 4 in the channel region is exposed.

Figure 14:
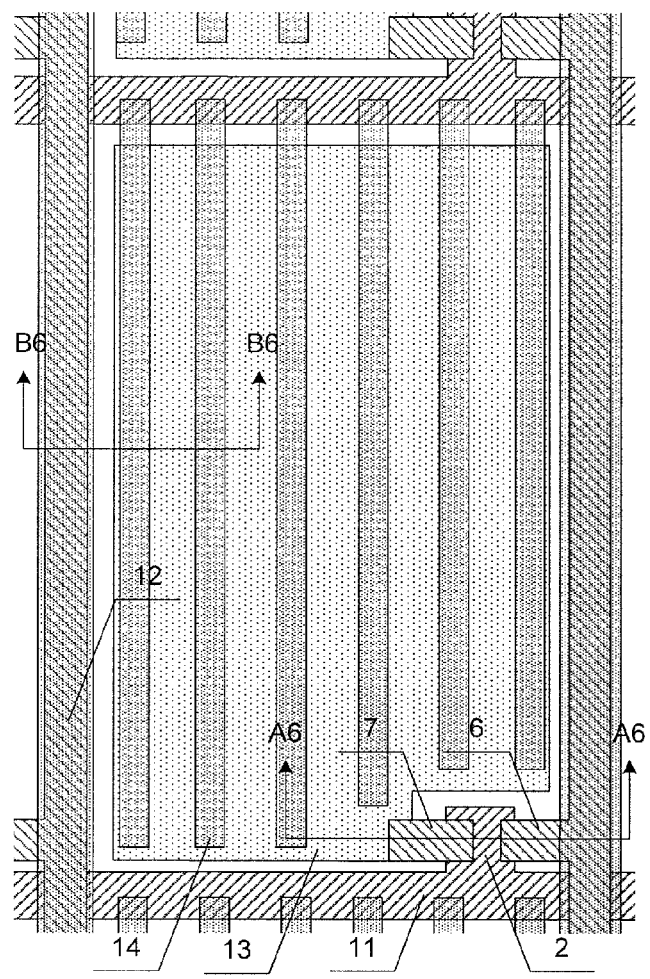
FIG. 14 is a plan view of the array substrate of the TFT-LCD after a fifth patterning process, according to the first embodiment of the disclosed technology.
Figure 15:
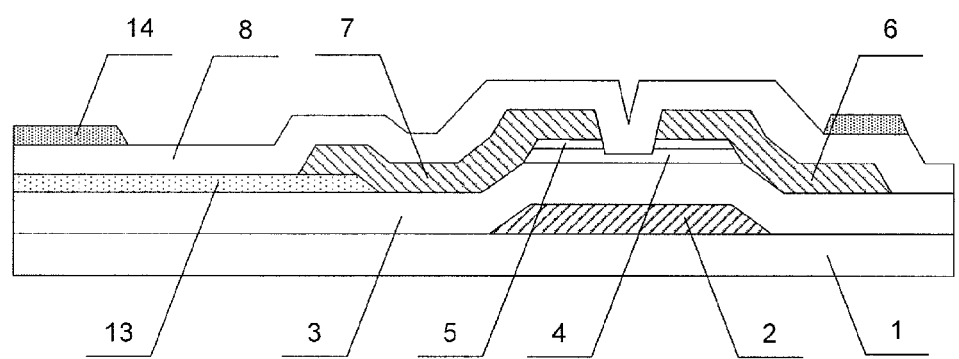
FIG. 15 is a cross-sectional view taken along a line A6-A6 in FIG. 14.
Figure 16:
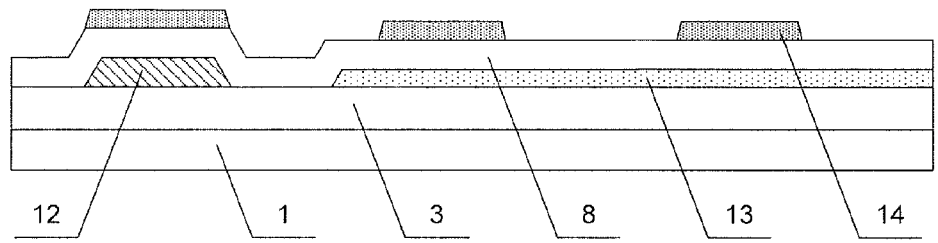
FIG. 16 is a cross-sectional view taken along a line B6-B6 in FIG. 14.

FIG. 14 is a plan view of the array substrate of the TFT-LCD after a fifth patterning process according to the first embodiment of the disclosed technology, showing the structure of one pixel region, FIG. 15 is a cross-sectional view taken along a line A6-A6 in FIG. 14, and FIG. 16 is a cross-sectional view taken along a line B6-B6 in FIG. 14.

The passivation layer 8 is deposited on the base substrate with the pattern as shown in FIG. 11, by PECVD method, and covers the entire base substrate 1. Then, a transparent conductive thin film is deposited by a magnetron sputtering method or a thermal evaporating method and next is patterned by the patterning process using a common mask plate, so as to form a pattern comprising the common electrode 14, as shown in FIGS. 14-16. The common electrode 14 within the pixel region is formed to have a plurality of strip electrodes arranged in parallel and in sequence, and is used to form the multi-dimensional space composite electrode together with the pixel electrode 13. The ends of the plurality of strip electrodes are set above but insulated from the gate line 11, while the strip electrodes of the common electrode 14 are also formed on the date line 12.

Finally, the black matrix metal thin film is deposited on the base substrate with the pattern as shown in FIG. 14, by a magnetron sputtering method or a thermal evaporating method, so as to form a pattern comprising the black matrix 9, and the black matrix 9 covers the common electrode 14 and is directly electrically connected with the common electrode 14. After completing a sixth patterning process, the resultant structure is shown in FIGS. 1-3. After this pattering process, the black matrix 9 is formed above the gate line 11, a data line 12, a source electrode 6, and drain electrode 7. Since the common electrode 14 comprising strip electrodes is provided above the gate line 11, the black matrix 9 above the gate line 11 is provided on the strip electrodes, and a directly electrical connection between the black matrix 9 and the common electrode 14 is achieved, so that the black matrix 9 not only effectively blocks the light leakage region, but also serves as the connecting bus line of the common electrodes 14. In this patterning process, since the common electrode is made of a transparent conductive thin film material, and the black matrix is made of a metal thin film material, this patterning process may be achieved by selecting an etching solution having a high etching rate for the metal thin film and a low etching rate for the transparent conductive thin film.

Since the black matrix of the present embodiment is made of a metal material, one reflection preventing layer may further be applied on a surface of the black matrix in order to prevent light reflection from the black matrix.

It should be note that the structure shown in FIG. 1 is only one of the exemplary structures of the array substrate of the TFT-LCD of the present embodiment, and structure modifications also exist according to the design concept of the present embodiment. For example, in the technology of the present embodiment, the black matrix pattern may be only disposed above the gate line rather than other positions (e.g., the positions of the date lines and the thin film transistor, etc.), but these positions are blocked by another black matrix at the corresponding position on the color filter substrate. The black matrix pattern may be only disposed above the date line rather than other positions (e.g., the positions of the gate line and the thin film transistor), but these positions are blocked by another black matrix at corresponding position on the color filter substrate. In this case, the common electrode of a strip structure may be connected with each other by a connection strip, and be connected with the black matrix. In another example, the black matrix pattern may be only disposed above the gate line and the data line rather than other positions (e.g., the positions of the thin film transistor, etc.), but these positions are blocked by another black matrix at corresponding position on the color filter substrate. In addition, slits parallel to each other may be formed in the pixel electrode formed by the patterning process as shown in FIG. 8, or the pixel electrode is also formed to comprise strip electrodes extended in parallel with each other.

Further, the processes shown in FIGS. 4-16 are only one example of the method for manufacturing the array substrate of the TFT-LCD of the embodiment, a new modified processes may be generated by increasing or reducing patterning processes. For example, the fifth patterning process may simultaneously form the common electrode and the black matrix by same one patterning process using a half-tone mask plate or a gray-tone mask plate. Hereinafter, the preparation process is simply described.

Figure 17:
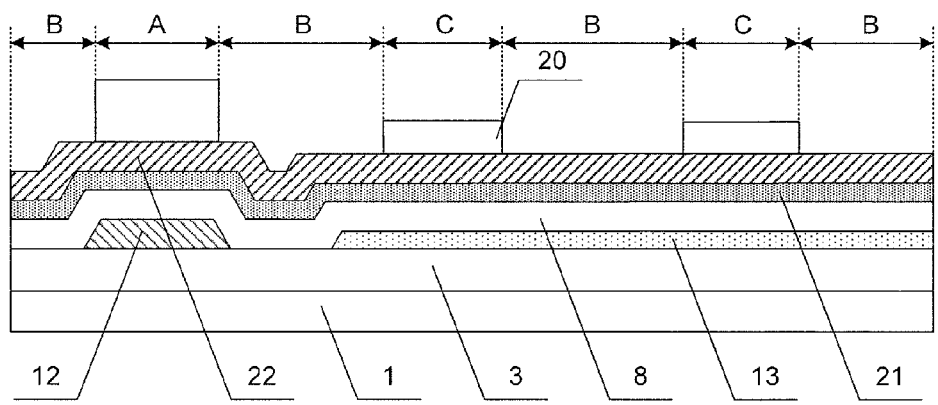
FIG. 17 is a cross-sectional view taken along a line B6-B6, showing the array substrate of the TFT-LCD after exposing and developing photoresist in the fifth patterning process according to the first embodiment of the disclosed technology.

FIG. 17 is a cross-sectional view taken along a line B6-B6, showing the array substrate of the TFT-LCD after exposing and developing photoresist in the fifth patterning process according to the first embodiment of the disclosed technology.

Firstly, the passivation layer 8 is deposited by a PECVD method, and then the transparent conductive thin film 21 and the black matrix metal thin film 22 are sequentially deposited by a magnetron sputtering method or a thermal evaporating method. A photoresist layer 20 is coated on the black matrix metal thin film, and is exposed by using a half-tone mask plate or a gray tone mask plate, and the developed photoresist 20 comprises a unexposed region A (completely remained photoresist region), a completely exposed region B (completely removed photoresist region), and a partially exposed region C (partially remained photoresist region), as shown in FIG. 17. The unexposed region A corresponds to a region where a black matrix pattern is formed, the partially exposed region C corresponds to a region where a common electrode pattern is formed, and the completely exposed region B corresponds to a region except for the above patterns. The thickness of the photoresist in the unexposed region A is larger than that in the partially exposed region C.

Figure 18:
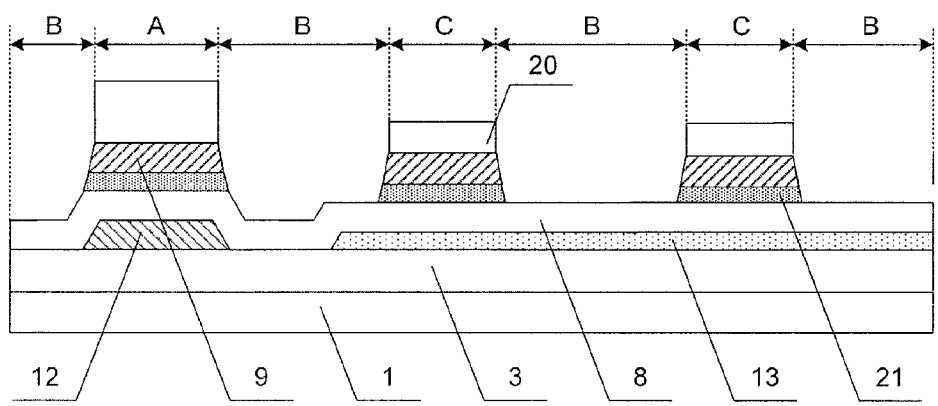
FIG. 18 is a cross-sectional view taken along a line B6-B6, showing the array substrate of the TFT-LCD after a first etching process in the fifth patterning process according to the first embodiment of the disclosed technology.

FIG. 18 is a cross-sectional view taken along a line B6-B6, showing the array substrate of the TFT-LCD after a first etching process in the fifth patterning process according to the first embodiment of the disclosed technology. The black matrix metal thin film 22 and the transparent conductive thin film 21 in the completely exposed region B are etched in the first etch process, so as to form a pattern comprising the black matrix 9, as shown in FIG. 18.

Figure 19:
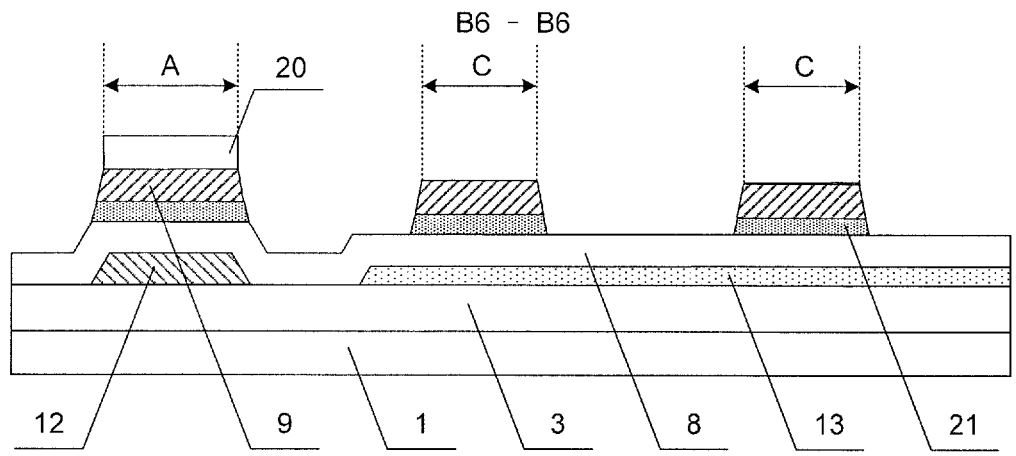
FIG. 19 is a cross-sectional view taken along a line B6-B6, showing the array substrate of the TFT-LCD after an ashing process in the fifth patterning process according to the first embodiment of the disclosed technology.

FIG. 19 is a cross-sectional view taken along a line B6-B6, showing the array substrate of the TFT-LCD after an ashing process in the fifth patterning process according to the first embodiment of the disclosed technology. The photoresist in the partially exposed region C is removed in the ashing process, so as to expose the black matrix metal thin film 22 in this region while reduce the thickness of the photoresist in the unexposed region A, as shown in FIG. 19.

Figure 20:
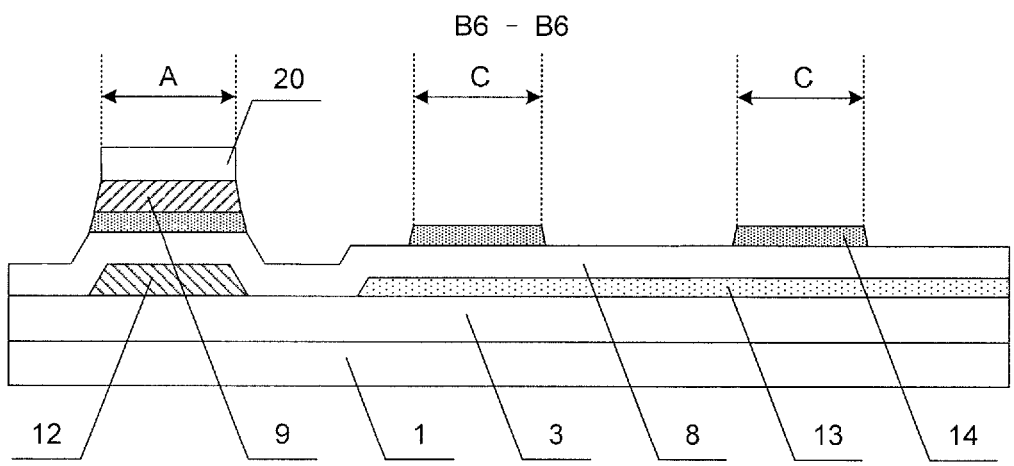
FIG. 20 is a cross-sectional view taken along a line B6-B6, showing the array substrate of the TFT-LCD after a second etching process in the fifth patterning process according to the first embodiment of the disclosed technology.

FIG. 20 is a cross-sectional view taken along a line B6-B6, showing the array substrate of the TFT-LCD after a second etching process in the fifth patterning process according to the first embodiment of the disclosed technology. The black matrix metal thin film 22 in the partially exposed region C is completely etched in the second etching process, so as to form a pattern comprising the common electrode 14, as shown in FIG. 20.

Finally, the remaining photoresist is removed, and the fifth patterning process for the array substrate of the TFT-LCD according to the first embodiment of the disclosed technology is completed, as shown in FIG. 3.

Figure 21:
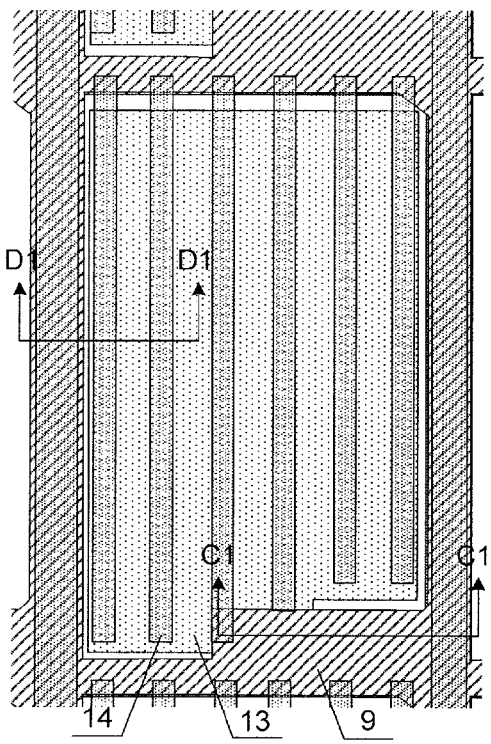
FIG. 21 is a plan view of the array substrate of the TFT-LCD according to a second embodiment of the disclosed technology.
Figure 22:
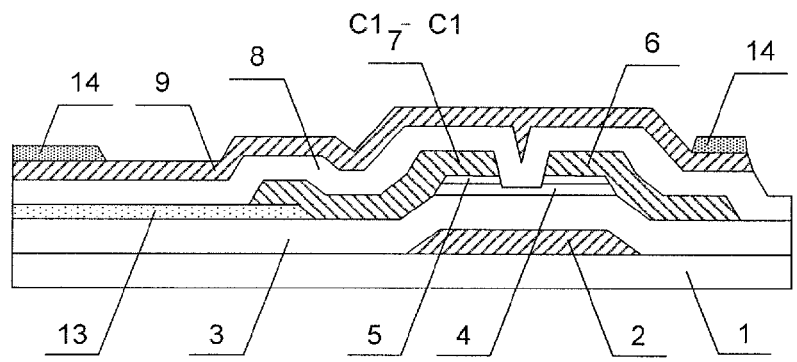
FIG. 22 is a cross-sectional view taken along a line C1-C1 in FIG. 21.
Figure 23:
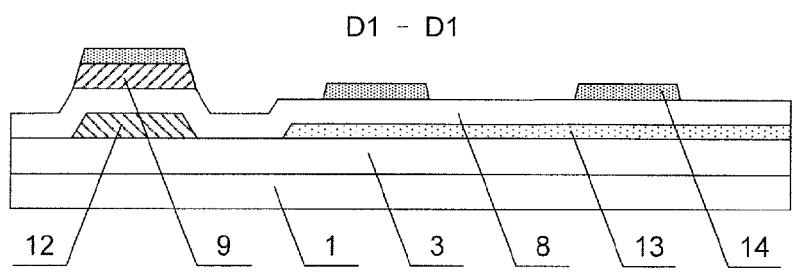
FIG. 23 is a cross-sectional view taken along a line D1-D1 in FIG. 21.

FIG. 21 is a plan view of the array substrate of the TFT-LCD according to a second embodiment of the disclosed technology, showing the structure of one pixel region, FIG. 22 is a cross-sectional view taken along a line C1-C1 in FIG. 21, and FIG. 23 is a cross-sectional view taken along a line D1-D1 in FIG. 21.

As FIGS. 21-23 shown, the present embodiment is a structure modification of the foregoing first embodiment. The main structure is substantially same as the first embodiment, and the difference lies in that the common electrode of the present embodiment is located above the black matrix, that is, the common electrode of a strip structure is provided on the black matrix to achieve the direct connection between the common electrode and the black matrix. The preparation processes of the present embodiment is also substantially same as that of the first embodiment, and the difference lies in that, in the present embodiment, the black matrix pattern is firstly formed on the passivation layer and then the common electrode pattern is formed and connected to the black matrix. Similarly, a surface of the black matrix in the present embodiment may be coated with an anti-reflection layer, the black matrix pattern may be only disposed above the gate line or the date line, or above the gate line and the date line, the details will not be repeated here.

An embodiment of the disclosed technology provides an array substrate of a TFT-LCD, on which the black matrix pattern is disposed. The black matrix is connected with the common electrode, so that the black matrix can effectively block the light leakage area and work as the connection bus line of the common electrode, thus the defects such as high structure cost and the common electrode delay can be overcome. Since the black matrix formed of a metal thin film material is formed above the gate line, the data line, the source electrode and the drain electrode, the width of the black matrix can be reduced and aperture ratio can be improved. The black matrix and the common electrode are disposed on the array substrate and directly connected with each other, so the common electrode delay can be completely eliminated. Thus, the array substrate of the TFT-LCD can be widely applied to the applications such as a large-sized display and a liquid crystal TV set, or the like.

An embodiment of a method for manufacturing an array substrate of the TFT-LCD of the disclosed technology, the method comprises the following steps:

Step 1, forming a pattern comprising a gate line, a data line, a pixel electrode and a thin film transistor on a base substrate; and Step 2, forming a pattern comprising a common electrode and a black matrix on the base substrate after step 1, the black matrix being electrically connected with the common electrode.

The embodiment of the disclosed technology provides an array substrate of a TFT-LCD. The black matrix pattern is disposed on the array substrate and is connected with the common electrode, so that the black matrix can not only effectively block the light leakage area but also work as the connection bus line of the common electrode, thus the defects such as the high structure cost and the common electrode delay can be overcome. Since the black matrix pattern can be prepared on the array substrate by conventional processes apparatus and process procedures, there is no need for additional production apparatuses. Also, the apparatus and processes for preparing the black pattern on the color filter substrate can be eliminated, so the production cost of the disclosed technology can be effectively reduced.

The above step 1 may further comprise:

Step 11, depositing a gate metal thin film on the base substrate, and forming the pattern comprising the gate line and a gate electrode by patterning the gate metal thin film;

Step 12, depositing the gate insulating layer, the semiconductor thin film and the doped semiconductor thin film in sequence on the base substrate after step 11, and forming the pattern comprising the active layer by a patterning process, wherein the active layer comprises the laminated layer structure of the semiconductor layer and the doped semiconductor layer and is formed on the gate insulating layer and above the gate electrode;

Step 13, depositing the transparent conductive thin film on the base substrate after step 12, and forming the pattern comprising the pixel electrode by a patterning process;

Step 14, depositing the source and drain metal thin film on the substrate after step 13, and forming the pattern comprising the date line, and the source electrode, the drain electrode and the channel region of the thin film transistor by a patterning process, wherein one end of the source electrode is located on the active layer, and the other end is connected with the date line; one end of the drain electrode is located on the active layer, and the other end is directly connected with the pixel electrode; the channel region is defined between the source electrode and the drain electrode.

The above preparation procedure has been described in detail in the embodiment as shown in FIGS. 4-13, so the description is not repeated here.

In the first example of the method for manufacturing the array substrate according to the embodiment of the disclosed technology, the step 2 comprises:

Step 211, depositing the passivation layer and the transparent conductive thin film on the base substrate after step 1, and patterning the transparent conductive thin film to form the pattern comprising the common electrode by the patterning process using a common mask plate, the common electrode comprises a plurality of strip electrodes arranged in sequence;

Step 212, depositing the black matrix metal thin film on the substrate after step 211, and patterning the black matrix metal thin film to form the pattern comprising the black matrix by the patterning process using a common mask plate, wherein the black matrix is connected with the common electrode.

This example is to form the black matrix pattern and the common electrode pattern by two patterning processes, the black matrix is located above the common electrode, and the preparation procedure has been described in detail in the embodiment as shown in FIGS. 14-16.

In the second example of the method for manufacturing the array substrate according to the embodiment of the disclosed technology, the step 2 comprises:

Step 221, firstly depositing the passivation layer on the base substrate after step 1, and then continuously depositing the transparent conductive thin film and the black matrix metal thin film;

Step 222, coating a photoresist layer on the black matrix metal thin film;

Step 223, exposing the photoresist layer by a half-tone mask plate or a gray tone mask plate, developing the photoresist layer to form a completely remained photoresist region, a completely removed photoresist region, and a partially remained photoresist region; wherein the completely remained photoresist region corresponds to the region in which the black matrix pattern exists, the partially remained photoresist region corresponds to the region in which the common electrode pattern exists, and the completely removed photoresist region corresponds to the region except for the above patterns.

Step 224, etching the black matrix metal thin film and the transparent conductive thin film in the completely removed photoresist region B by a first etch process, to form the pattern comprising the black matrix;

Step 225, removing the photoresist in the partially remained photoresist region by an ashing process, to expose the black matrix metal thin film in this region;

Step 226, completely removing the black matrix metal thin film in the partially remained photoresist region by a second etching process to form the pattern comprising the common electrode; and Step 227, removing the remaining photoresist.

The present example is to form the black matrix pattern and the common electrode pattern by one patterning process, the black matrix is located above the common electrode, and the preparation procedure has been described in detail in the embodiment as shown in FIGS. 17-20, In the third example of the method for manufacturing the array substrate according to the embodiment of the disclosed technology, the step 2 comprises:

Step 231, depositing the passivation layer and the black matrix metal thin film on the base substrate after step 1, and patterning the black matrix metal thin film to form the pattern comprising the black matrix by the patterning process using a common mask plate;

Step 232, depositing the transparent conductive thin film on the base substrate after step 231, and patterning the transparent conductive thin film to form the pattern comprising common electrode by the patterning process using a common mask plate, the common electrode comprises a plurality of strip electrodes arranged in sequence and is connected with the black matrix.

The present example is to form the black matrix pattern and the common electrode pattern by two patterning processes, and the common electrode is located above the black matrix.

Since the black matrix in the embodiment of the disclosed technology comprises a metal material, in order to prevent the light reflection from the black matrix, a step of applying one anti-reflection layer on the surface of the black matrix can be added behind the step 2.

In the embodiment of the disclosed technology, the black matrix also may be made of a non-metal conductive thin film material, such as carbon nanotube material.

The conductivity of the conductive thin film material for forming the black matrix may be higher than that of the common electrode.

The black matrix also may be horizontally connected with the common electrode and formed in the same layer.

It should be noted that: the above description is only for the purpose of explaining the disclosed technology but not for a limitation, although the disclosed technology has been described in detail with reference to the preferred embodiments, those skilled in the art should understand that change and alternation can be made in the technologies of the disclosed technology without depart from the spirit and scope of the disclosed technology.

What is claimed is:

1. An array substrate of a thin film transistor liquid crystal display (TFT-LCD), comprising:
    a base substrate;
    gate lines and data lines forming on the base substrate and defining pixel regions, wherein a pixel electrode, a thin film transistor, and a common electrode which forms a multi-dimensional space composite field together with the pixel electrode, are disposed in each of the pixel regions, and
    a black matrix made of a conductive material, wherein the black matrix is electrically connected with the common electrode,
    wherein an anti-reflection layer is deposited on a surface of the black matrix.

2. The array substrate of the TFT-LCD according to claim 1, wherein the thin film transistor comprises a gate electrode, an active layer, a source electrode and a drain electrode, and a passivation layer is formed on the thin film transistor and covers the base substrate.

3. The array substrate of the TFT-LCD according to claim 2, wherein the black matrix is provided on the passivation layer and the common electrode.

4. The array substrate of the TFT-LCD according to claim 3, wherein the common electrode and the black matrix are formed in the same patterning process.

5. The array substrate of the TFT-LCD according to claim 2, wherein the black matrix is provided on the passivation layer, the common electrode comprises a plurality of strip electrodes arranged in sequence and is provided on the black matrix.

6. The array substrate of the TFT-LCD according to claim 5, wherein the black matrix and the common electrode are formed in different patterning processes.

7. The array substrate of the TFT-LCD according to claim 1, wherein the black matrix comprises a portion of the black matrix located above the gate line and/or the data line.

8. The array substrate of the TFT-LCD according to claim 7, wherein the black matrix comprises a portion of the black matrix located above the thin film transistor.

9. The array substrate of the TFT-LCD according to claim 1, wherein the black matrix is made of a metal thin film material.

10. The array substrate of the TFT-LCD according to claim 1, wherein the black matrix is made of a carbon nanotube material.

11. The array substrate of the TFT-LCD according to claim 1, wherein the conductivity of the conductive material for forming the black matrix is higher than that of the common electrode.

12. The array substrate of the TFT-LCD according to claim 1, wherein the black matrix is directly electrically connected with the common electrode.

13. A method for manufacturing an array substrate of the TFT-LCD, comprising:
    step 1, forming a gate line, a data line, a pixel electrode and a thin film transistor on a base substrate;
    step 2, forming a common electrode and a black matrix on the base substrate after step 1, the black matrix is electrically connected with the common electrode; and
    step 3, depositing an anti-reflection layer on a surface of the black matrix.

14. The method according to claim 13, wherein the forming of the gate line, the data line, the pixel electrode, and the thin film transistor comprises:
    depositing a gate metal thin film on the base substrate, and patterning the gate metal thin film to form the gate line and a gate electrode;
    depositing a gate insulating layer, a semiconductor thin film and a doped semiconductor thin film in sequence on the base substrate, and forming an active layer for the thin film transistors by a patterning process, wherein the active layer comprises the semiconductor layer and doped semiconductor layer and is formed on the gate insulating layer and above the gate electrode;
    depositing a transparent conductive thin film on the base substrate and patterning the transparent conductive thin film to form the pixel electrode; and
    depositing a source and drain metal thin film on the base substrate and patterning the source and drain metal thin film to form the data line, and a source electrode, a drain electrode and a channel region of the thin film transistor, wherein one end of the source electrode is located on the active layer, and the other end is connected with the data line, one end of the drain electrode is located on the active layer, and the other end is directly connected with the pixel electrode, and the channel region is defined between the source electrode and the drain electrode.

15. The method of claim 13, wherein the forming of the common electrode and the black matrix comprises:
    depositing a passivation layer and a transparent conductive thin film on the base substrate after step 1, and patterning the transparent conductive thin film to form the common electrode, wherein the common electrode comprises a plurality of strip electrodes arranged in sequence; and
    depositing a black matrix conductive thin film on the base substrate on which the common electrode has formed, and patterning the black matrix conductive thin film to form the black matrix, wherein the black matrix is electrically connected with the common electrode.

16. The method of claim 13, wherein the forming of the common electrode and the black matrix comprises:
    depositing a passivation layer on the base substrate after step 1, and then depositing the transparent conductive thin film and the black matrix conductive thin film in sequence;
    coating a photoresist layer on the black matrix conductive thin film;
    exposing the photoresist layer by using a half-tone mask plate or a gray-tone mask plate, developing the photoresist layer to form a completely remained photoresist region, a completely removed photoresist region, and a partially remained photoresist region, wherein the completely remained photoresist region corresponds to the region in which the black matrix pattern exists, the partially remained photoresist region corresponds to the region in which the common electrode pattern exists, and the completely removed photoresist region corresponds to the region except for the above patterns;
    etching the black matrix conductive thin film and the transparent conductive thin film in the completely removed photoresist region by a first etch process to form the black matrix;
    removing the photoresist in the partially remained photoresist region by an ashing process, to expose the black matrix conductive thin film in this region;
    completely removing the black matrix conductive thin film in the partially remained photoresist region by a second etching process to form the common electrode; and
    removing the remaining photoresist.

17. The method of claim 13, wherein the forming of the common electrode and the black matrix comprise:
    depositing a passivation layer and a black matrix conductive thin film on the base substrate after step 1, and patterning the black matrix conductive thin film to form the black matrix; and
    depositing a transparent conductive thin film on the base substrate on which the black matrix has been formed, and patterning a transparent conductive thin film to form the common electrode, wherein the common electrode comprise a plurality of strip electrodes arranged in sequence and are electrically connected with the black matrix.

18. The method of claim 13, wherein the black matrix conductive thin film is made of a metal thin film material or a carbon nanotube material.

19. The method of claim 13, wherein the conductivity of the conductive thin film material for forming the black matrix is higher than that of the common electrode.

* * * * *